US010517201B2

(12) United States Patent
Ikeyama et al.

(10) Patent No.: US 10,517,201 B2
(45) Date of Patent: Dec. 24, 2019

(54) CONTROL DEVICE FOR COMPONENT MOUNTING MACHINE

(71) Applicant: FUJI CORPORATION, Chiryu-shi (JP)

(72) Inventors: Jo Ikeyama, Nagoya (JP); Koushi Kuno, Chiryu (JP); Kazuhito Horaguchi, Chiryu (JP); Yuki Fujimura, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 72 days.

(21) Appl. No.: 15/774,385

(22) PCT Filed: Nov. 20, 2015

(86) PCT No.: PCT/JP2015/082698
§ 371 (c)(1),
(2) Date: May 8, 2018

(87) PCT Pub. No.: WO2017/085865
PCT Pub. Date: May 26, 2017

(65) Prior Publication Data
US 2019/0254203 A1    Aug. 15, 2019

(51) Int. Cl.
*H05K 13/08* (2006.01)
*H05K 13/04* (2006.01)

(52) U.S. Cl.
CPC ....... *H05K 13/086* (2018.08); *H05K 13/0409* (2018.08); *H05K 13/0419* (2018.08); *H05K 13/083* (2018.08); *H05K 13/0812* (2018.08); *G05B 2219/36195* (2013.01); *G05B 2219/45063* (2013.01)

(58) Field of Classification Search
None
See application file for complete search history.

(56) References Cited

U.S. PATENT DOCUMENTS

2017/0049013 A1* 2/2017 Kanai ................ H05K 13/0417

FOREIGN PATENT DOCUMENTS

| JP | 2011-54712 A | 3/2011 |
|---|---|---|
| JP | 5760153 B1 | 8/2015 |
| JP | 2015-159330 A | 9/2015 |

OTHER PUBLICATIONS

International Search Report dated Feb. 23, 2016 in PCT/JP2015/082698 filed Nov. 20, 2015.

* cited by examiner

*Primary Examiner* — Sean Shechtman
(74) *Attorney, Agent, or Firm* — Oblon, McClelland, Maier & Neustadt, L.L.P.

(57) ABSTRACT

A control device for the component mounting machine is provided with an error detecting section configured to detect a pickup error in which the electronic component was not picked up during pickup operation; a recovery control section configured to perform recovery processing of picking up the electronic component by performing the pickup operation again in a case in which a quantity of the pickup errors that has occurred consecutively during multiple attempts at the pickup operation is less than a threshold value; a tape management section configured to acquire a remaining amount of the carrier tape at the feeder; and a threshold changing section configured to change the threshold value in accordance with the acquired remaining amount of the carrier tape.

7 Claims, 9 Drawing Sheets

FIG. 6

R: Carrier tape remaining amount    T0: Threshold Tr initial value = 2
N: Quantity of consecutive pickup errors    K: Change constant = 1

| R \ N | Remaining amount R ≥ Specified amount M (Tr = T0 = 2) | Remaining amount R < Specified amount M (Tr = T0 + K = 3) |
|---|---|---|
| 1 | Recovery processing | Recovery processing |
| 2 | Report pickup operation error | Recovery processing |
| 3 | — | Tape exchange processing |

FIG. 8

R: Carrier tape remaining amount  　　TO: Threshold Tr initial value = 2
N: Quantity of consecutive pickup errors  　K: Change constant = 1

| R \ N | Remaining amount R ≥ Specified amount M (Tr = T0 = 2) | Remaining amount R < Specified amount M (Tr = T0 + K = 3) |
|---|---|---|
| 1 | Recovery processing | Recovery processing |
| 2 | Report pickup operation error | Recovery processing |
| 3 | — | Report component run-out or report to check splicing section |

FIG. 9

R: Carrier tape remaining amount  T0: Threshold Tr initial value = 2
N: Quantity of consecutive pickup errors  K: Change constant = -1

| N \ R | Remaining amount R ≥ Specified amount M (Tr = T0 = 2) | Remaining amount R < Specified amount M (Tr = T0 + K = 1) |
|---|---|---|
| 1 | Recovery processing | Recovery processing |
| 2 | Report pickup operation error | — |
| 3 | — | — |

CONTROL DEVICE FOR COMPONENT MOUNTING MACHINE

TECHNICAL FIELD

The present application relates to a control device for a component mounting machine.

BACKGROUND ART

During mounting processing of mounting an electronic component on a circuit board, a component mounting machine performs pickup work of picking up an electronic component supplied by a feeder. In patent literature 1, a configuration is disclosed in which, in a case in which a pickup error is detected in which the electronic component was not picked up during pickup operation, recovery processing of picking up the electronic component by performing pickup operation again is performed. However, it is not possible to perform recovery processing according to a cause of the pickup error. Thus, for example, in a case in which a quantity of consecutive pickup errors reaches a set value, a control device notifies an operator that recovery work by the operator is required without performing recovery processing.

CITATION LIST

Patent Literature

Patent literature 1: JP-A-2015-159330

BRIEF SUMMARY

Technical Problem

However, pickup errors may occur due to various reasons. Therefore, during mounting processing, there are cases in which recovery work should be performed immediately, and cases in which recovery processing should be performed repeatedly an appropriate number of times. Thus, setting the appropriate quantity of times for repeatedly performing recovery processing is not easy.

The present disclosure takes account of such circumstances, and an object therefore is to provide a control device for a component mounting machine that is able to appropriately perform recovery processing in accordance with a state of carrier tape in a feeder.

Solution to Problem

A control device of the present disclosure is applicable to a component mounting machine that mounts electronic components on a circuit board. The component mounting machine is provided with a feeder that supplies electronic components by feeding carrier tape in which electronic components are housed. The control device is provided with: an error detecting section configured to detect a pickup error in which the electronic component was not picked up during pickup operation of picking up and holding the electronic component supplied by the feeder; a recovery control section configured to perform recovery processing of picking up the electronic component by performing the pickup operation again in a case in which a quantity of the pickup errors that has occurred consecutively during multiple attempts at the pickup operation is less than a threshold value; a tape management section configured to acquire a remaining amount of the carrier tape at the feeder; and a threshold changing section configured to change the threshold value in accordance with the acquired remaining amount of the carrier tape.

Advantageous Effects

According to the configuration of the present disclosure, a threshold value, which is a reference by which it is determined whether or not to perform recovery processing, is changed automatically in accordance with the remaining amount of the carrier tape. Here, a pickup error is something that causes a supply error such as components running out at a feeder. Thus, the remaining amount of the carrier tape can be used as an indicator that shows whether it is necessary to perform recovery processing with respect to a pickup error that has occurred. For this, by the above configuration, it is possible to appropriately perform recovery processing in accordance with the state of the carrier tape.

BRIEF DESCRIPTION OF DRAWINGS

FIG. 6 is a countermeasure table showing the relationship between countermeasures performed in accordance with the quantity of consecutive pickup errors and the remaining amount of carrier tape.

FIG. 8 is a table showing the relationship between countermeasures according to the quantity of consecutive pickup errors and the remaining amount of carrier tape in the first alternative embodiment.

FIG. 9 is a table showing the relationship between countermeasures according to the quantity of consecutive pickup errors and the remaining amount of carrier tape in the second alternative embodiment.

DESCRIPTION OF EMBODIMENTS

An embodiment of the present disclosure, a control device for a component mounting machine, is described below with reference to the drawings. The component mounting machine configures a production line that manufactures circuit board products such as integrated circuits.

Embodiment

Configuration of Component Mounting Machine 1

Figure 1:
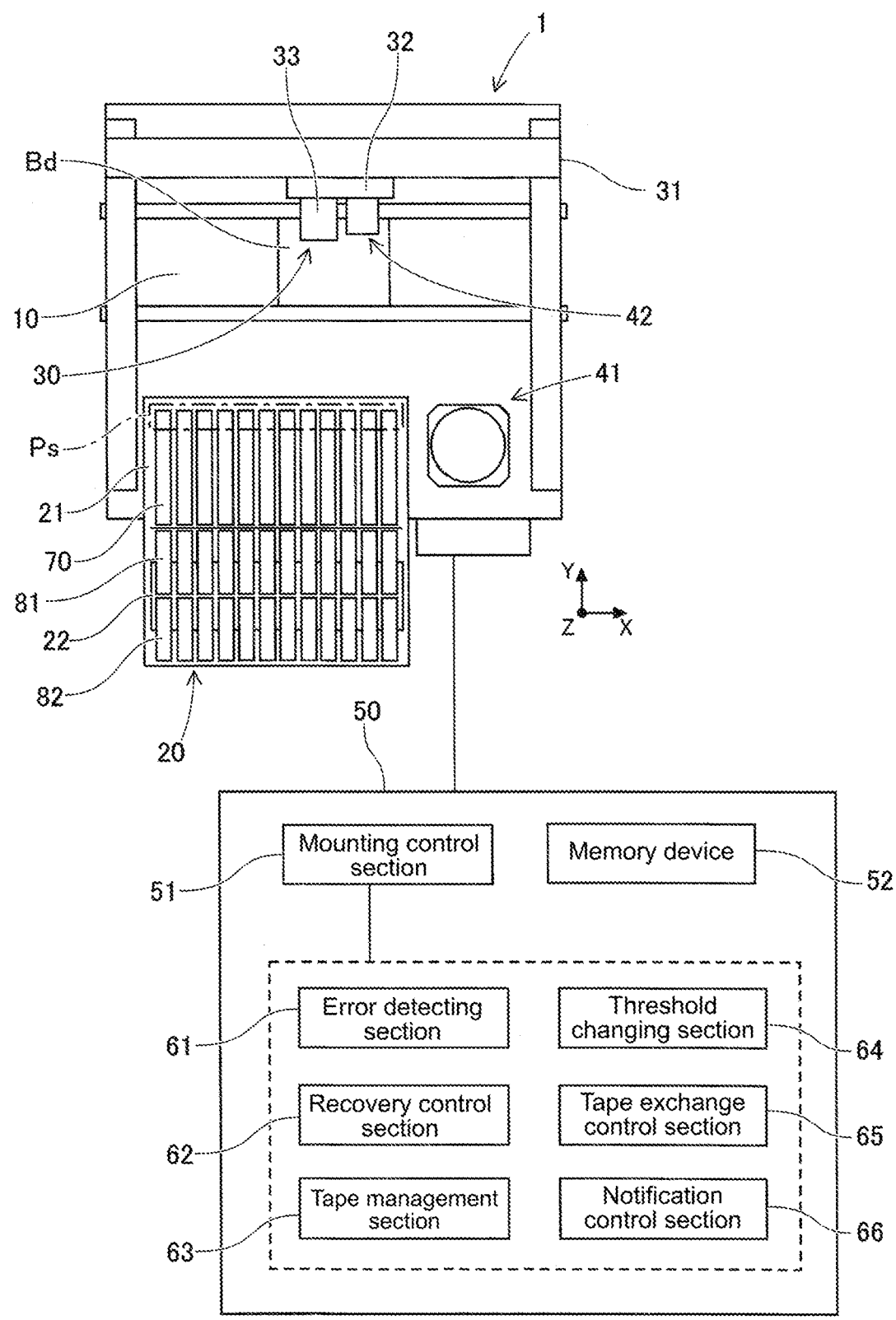
FIG. 1 is a conceptual view showing a component mounting machine and a control device for an embodiment.

As shown in FIG. 1, component mounting machine 1 is provided with board conveyance device 10, component supply device 20, component transfer device 30, component camera 41, board camera 42, and control device 50. In the descriptions below, the horizontal width direction of component mounting machine 1 (left-right direction in FIG. 1) is the X-axis direction, the horizontal depth direction of component mounting machine 1 (up-down direction in FIG.

1) is the Y-axis direction, and the direction perpendicular to the X axis and Y axis (perpendicular to the page in FIG. 1) is the Z-axis direction.

Board conveyance device 10 is configured from a belt conveyor or the like and consecutively conveys boards Bd in a conveyance direction (in the present embodiment, the X-axis direction). Board conveyance device 10 positions board Bd at a specified position inside component mounting machine 1. Then, after mounting processing has been performed by component mounting machine 1, board conveyance device 10 unloads board Bd from component mounting machine 1.

Component supply device 20 supplies electronic components that are mounted on board Bd to supply position Ps. Component supply device 20 includes multiple slots 21 and multiple reel holding sections 22 arranged lined up in the X-axis direction. Feeders 70 are removably set in each of the multiple slots 21. Component supply device 20 supplies electronic components to pickup section Dt (refer to FIG. 4) positioned at the leading end of feeder 70 (the upper side in FIG. 1) by feeder 70 feeding carrier tape 90. The detailed configuration of feeder 70 is described later.

Reel holding section 22 exchangeably holds a first reel 81 and a second reel 82 around which carrier tape 90 is wound. First reel 81 and second reel 82 are arranged lined up in the Y direction with respect to each feeder 70. Reel holding section 22 is configured such that carrier tape 90 is able to be supplied to one feeder 70 from first reel 81 and second reel 82.

Component transfer device 30 is configured to move in the X-axis direction and the Y-axis direction. Component transfer device 30 is arranged from the rear side in the lengthwise direction of component mounting machine 1 (the upper side in FIG. 1) to above component supply device 20 at the front of component mounting machine 1. Component transfer device 30 is provided with head driving device 31, moving body 32, and mounting head 33. Head driving device 31 is configured to move moving body 32 in the XY-axis directions using a linear motion mechanism.

Mounting head 33 is fixed to moving body 32 by a clamp that is not shown. Also, multiple suction nozzles, which are not shown, are removably provided on mounting head 33. Mounting head 33 supports each suction nozzle so as to be rotatable around an R axis parallel to the Z axis and able to be raised/lowered. The height position and angle of each suction nozzle with respect to mounting head 33 and the state of supply of negative pressure to each suction nozzle is controlled. Each suction nozzle, by being supplied with negative pressure, picks up and holds an electronic component at pickup section Dt of feeder 70.

Component camera 41 and board camera 42 are digital cameras with an imaging element such as a charge coupled device (CCD) or a complementary metal oxide semiconductor (CMOS). Component camera 41 and board camera 42 each perform imaging of a visual field range based on a control signal from control device 50 that is communicatively connected to component camera 41 and board camera 42, and transmit image data acquired from the imaging operation to control device 50.

Component camera 41 is fixed to a base of component mounting machine 1 such that a light axis is aligned in the vertical direction (Z-axis direction), and is configured to be able to image component transfer device 30 from below. More specifically, component camera 41 is configured to be able to image the bottom surface of an electronic component being held by the suction nozzle. Board camera 42 is fixed to moving body 32 of component transfer device 30 such that the light axis faces down in a vertical direction (the Z-axis direction). Board camera 42 is configured to be able to image board Bd.

Configuration of Control Device 50

Control device 50 is configured mainly from a CPU, various types of memory, and control circuits. Control device 50 controls mounting processing of electronic components. Details of mounting processing by component mounting machine 1 are described later. As shown in FIG. 1, control device 50 is provided with mounting control section 51 and memory device 52.

Mounting control section 51 controls the position of mounting head 33 and operation of the pickup mechanism. Mounting control section 51 receives information outputted from various sensors provided on component mounting machine 1, and results of recognition processing by image processing and the like. Also, mounting control section 51 sends control signals to component transfer device 30 based on a control program memorized in memory device 52, information from the various sensors, and the results of various types of recognition processing. By this, the position and rotation angle of the suction nozzle supported on mounting head 33 are controlled.

Also, mounting control section 51, in a case in which a pickup error is detected in which the electronic component was not picked up during pickup operation of picking up an electronic component, performs recovery processing of picking up the electronic component by performing pickup operation again. The detailed configuration of mounting control section 51 and details of each of the types of processing such as recovery processing corresponding to detected pickup errors are described later.

Memory device 52 is configured from an optical drive device such as a hard disk device, flash memory, or the like. Memory device 52 memorizes a control program, control information, image data, temporary data of each processing during image processing, and the like. Also, the threshold value that is a reference by which it is determined whether or not to perform recovery processing is memorized in memory device 52.

Electronic Component Mounting Control

Figure 2:
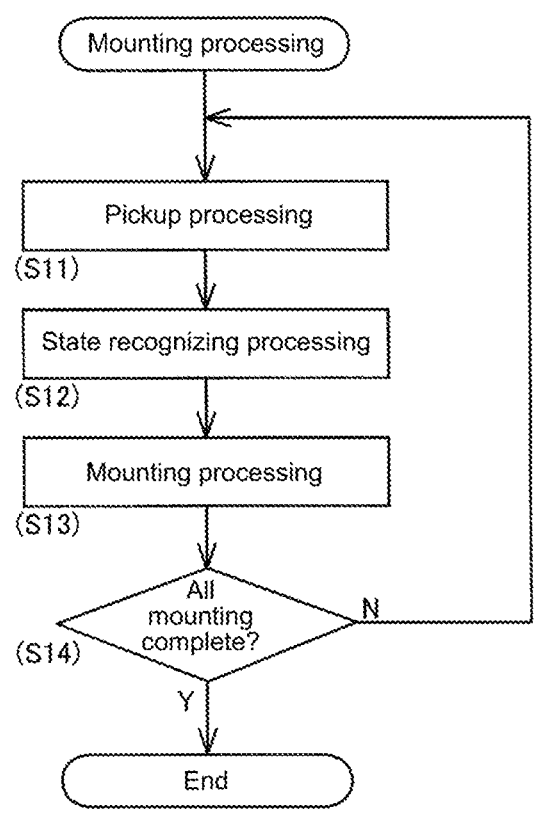
FIG. 2 is a flow diagram showing mounting processing by the component mounting machine.

Mounting processing of electronic components by component mounting machine 1 is described with reference to FIG. 2. During mounting processing, control device 50 of component mounting machine 1 first performs pickup processing in accordance with the control program (step 11 [hereinafter "step" is indicated by "S"]). During pickup processing (S11), pickup operation of picking up and holding an electronic component supplied by feeder 70 is performed consecutively for multiple suction nozzles.

Next, mounting control section 51, while mounting head 33 is moving above the mounting position on board Bd, performs recognition processing of recognizing the holding state of the electronic component held by the suction nozzle (S12). In detail, mounting control section 51 acquires image data obtained by imaging by component camera 41, and uses image processing to recognize whether an electronic component is being held by each suction nozzle, and to recognize the orientation of the held electronic components.

Then, control device 50 of component mounting machine 1 performs mounting processing of consecutively mounting the electronic components on board Bd (S13). Here, mounting control section 51 mounts the electronic components after correcting the position and angle of the suction nozzle in accordance with the holding state of the electronic component recognized by the state recognition processing (S12). Then, control device 50 determines whether mounting of all the electronic components has been completed (S14), and repeats the above processing (S11 to S14) until mounting is complete.

Configuration of Carrier Tape 90

Figure 3:
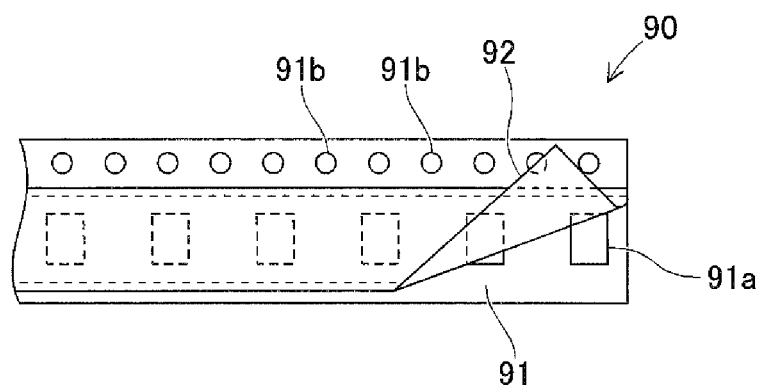
FIG. 3 is a plan view of a portion of carrier tape.

As described above, carrier tape 90 is wound around first reel 81 and second reel 82 held in reel holding section 22. Carrier tape 90 stores many components, such as electronic components, arranged in a line. As shown in FIG. 3, carrier tape 90 includes base tape 91 and cover tape 92. Note that, in FIG. 3, the leading end of carrier tape 90 is shown.

Base tape 91 is formed of a flexible material such as paper or resin. Base tape 91 is provided with component storage sections 91a formed at a center section in the width direction (up-down direction in FIG. 3). Component storage sections 91a are a recess with a bottom. Component storage sections 91a are formed at regular intervals in the conveyance direction (lengthwise direction, left-right direction in FIG. 3) of base tape 91. One component is stored in each of the component storage sections 91a.

Also, base tape 91 includes indexing holes 91b formed at an edge section in the width direction of base tape 91. Indexing holes 91b are formed at regular intervals in the conveyance direction of base tape 91. Indexing holes 91b are formed so as to pierce through carrier tape 90 in the up-down direction (the thickness direction of carrier tape 90). In the present embodiment, the interval between respective indexing holes 91b is set to be smaller than the interval between respective component storage sections 91a.

Cover tape 92 is formed from a thin polymer film. Both sides of cover tape 92 in the width direction are attached to the upper surface of base tape 91. By this, cover tape 92 covers the openings of component storage sections 91a. With carrier tape with this kind of configuration, components stored in component storage sections 91a of base tape 91 are prevented from falling out.

Configuration of Feeder 70

Feeder 70 is set in a slot 21 of component supply device 20, and carrier tape 90 is supplied from first reel 81 and second reel 82 held on reel holding section 22. Feeder 70 supplies components by indexing carrier tape 90 inserted from insertion section Di such that components are able to be removed from pickup section Dt. In this manner, feeder 70, in the present embodiment, is a tape type feeder onto which carrier tape 90 is loaded, with electronic components being stored in carrier tape 90.

Also, feeder 70 is configured to be able to supply components continuously without splicing a replenishment carrier tape to a current carrier tape 90 that is in use. Specifically, feeder 70 holds replenishment carrier tape 90 in a standby state above the current carrier tape 90. Then, the replenishment carrier tape 90 starts to be fed after the current carrier tape 90 has been ejected.

Figure 4:
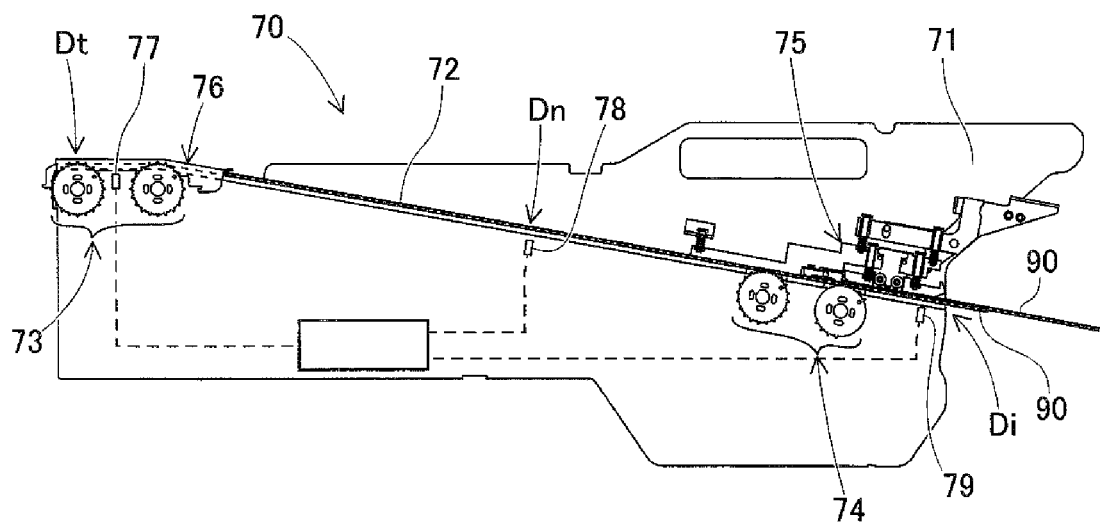
FIG. 4 shows an entire feeder.

As shown in FIG. 4, feeder 70 includes case 71, rail 72, first driving device 73, second driving device 74, tape feeding unit 75, tape peeling unit 76, and multiple detection sensors 77 to 79. Case 71 is formed in a flat box shape, and is fixed in position by being inserted into a slot 21 of component supply device 20. Rail 72 is provided from insertion section Di at the rear section of case 71 to pickup section Dt at the front section of case 71. The upper surface of rail 72 configures a portion of the conveyance path of carrier tape 90.

First driving device 73 includes a pair of sprockets provided below rail 72 at pickup section Dt. Second driving device 74 includes a pair of sprockets provided below the rail at insertion section Di. Each sprocket is arranged such that a portion protrudes to the upper surface side of rail 72 from a window formed in rail 72, so as to be engageable with indexing holes 91b of carrier tape 90.

First driving device 73 and second driving device 74 simultaneously rotate each sprocket via a stepping motor, which is not shown. First driving device 73 configured in such a manner configures a mechanism that drives carrier tape 90 on rail 72 to pickup section Dt. Further, second driving 74 configures a feeding mechanism that feeds a leading end of carrier tape 90 from the insertion section Di to first driving device 73 when the leading end of the carrier tape 90 has been inserted into insertion section Di.

Tape feeding unit 75 is arranged above rail 72 at which second driving device 74 is positioned, in the conveyance direction of carrier tape 90. Tape feeding unit 75 pushes carrier tape 90 positioned within rail 72 against rail 72. By this, tape feeding unit 75 assists the sprocket of second driving device 74 to engage with indexing holes 91b of carrier tape 90. Also, tape feeding unit 75 has a function to hold replenishment carrier tape 90 inserted in advance with respect to current carrier tape 90.

Tape peeling unit 76 is arranged above rail 72 at which the sprockets of first driving device 73 are positioned in the conveyance direction of carrier tape 90. Tape peeling unit 76 peels cover tape 92 of the fed carrier tape 90 from base tape 91 such that components are exposed at pickup section Dt.

Multiple detection sensors 77 to 79 are for detecting the presence of carrier tape 90 at three different locations on rail 72 (pickup section Dt, intermediate section Dn, and insertion section Di). In the present embodiment, first detection sensor 77 arranged at pickup section Dt detects the presence of carrier tape 90 at pickup section Dt by contacting carrier tape 90 on rail 72.

Second detection sensor 78 arranged at an intermediate section between pickup section Dt and insertion section Di detects the presence of carrier tape 90 at intermediate section Dn by contacting carrier tape 90 on rail 72. Further, third detection sensor 99 arranged at insertion section Di detects the presence of current and replenishment carrier tapes 90 at insertion section Di by the operating state of tape feeding unit 75 (the operating state of pushing carrier tape 90 against rail 72).

Also, feeder 70 detects which section on the conveyance path the trailing end of carrier tape 90 is based on detect results from the multiple detection sensors 77 to 79. For example, if carrier tape 90 is only detected by first detection sensor 77, the trailing end of carrier tape 90 is detected as being between second detection sensor 78 and first detection sensor 77.

Further, in a case in which first detection sensor 77 becomes unable to detect carrier tape 90 due to carrier tape 90 being fed from the above state and the operation amount of first driving device 73 is less than a specified amount, the trailing end of carrier tape 90 is detected as being between first detection sensor 77 and pickup section Dt. In this manner, the multiple detection sensors 77 to 79 configure a trailing end detecting section that is able to detect the trailing end carrier tape 90 on the conveyance path in addition to a control section that controls operation of first driving device 73.

Feeder 70 with such a configuration, in a reset state, after the leading end of carrier tape 90 has been inserted into insertion section Di, automatically feeds the leading end carrier tape 90 to first driving device 73 via intermediate section Dn by the driving of second driving device 74, thus automatically feeding carrier tape 90 to pickup section Dt by the driving of first driving device 73, so as to load carrier tape 90. Note that, a "reset state" of feeder 70 above refers to a state in which carrier tape 90 is not loaded on feeder 70, that is, a state in which carrier tape 90 is not present at any of the above positions on rail 72.

In this manner, feeder 70 includes first driving device 73 that pulls carrier tape 90, and second driving device 74 that feeds carrier tape 90. In other words, feeder 70 is an auto loading type feeder that performs exchange processing of creating a state in which electronic components can be supplied by, when the remaining amount of current carrier tape 90 is less than a specified amount, ejecting current carrier tape 90 and feeding replenishment carrier tape 90.

Here, the multiple detection sensors 77 to 79, when carrier tape 90 is fed, detect the carrier tape 90 sequentially, and output a detection result to control device 50 of component mounting machine 1 via a control section of feeder 70. Feeder 70 performs the exchange processing of the carrier tape 90 in a case in which a control instruction sent from tape exchange control section 65 of control device 50 is received based on the detection results of detection sensors 77 to 79.

Configuration of Mounting Control Section 51

As shown in FIG. 1, mounting control section 51 of control device 50 is provided with error detecting section 61, recovery control section 62, tape management section 63, threshold changing section 64, tape exchange control section 65, and notification control section 66. Error detecting section 61 detects a pickup error in which an electronic component is not picked up during pickup operation of picking up and holding an electronic component supplied by feeder 70.

In the present embodiment, error detecting section 61, in state recognition processing (S12) of mounting control (refer to FIG. 2), determines whether an electronic component is being held by a suction nozzle based on image data obtained by imaging using component camera 41. Error detecting section 61, in a case in which a suction nozzle that should be holding an electronic component is not holding an electronic component, determines that a pickup error has occurred. Note that, a cause of a pickup error may be components running out at feeder 70, a drop in pickup power due to a problem at the tip of the suction nozzle, or the like.

Recovery control section 62, in a case in which the quantity of consecutive pickup errors during multiple pickup operations is less than a threshold value, performs recovery processing of attempting to pick up the electronic component by performing pickup operation again. During recovery processing, recovery control section 62 outputs a control instruction to feeder 70 so as to feeder carrier tape 90 by one pitch (distance between storage locations of electronic components). Then, pickup of the target electronic components is performed in the subsequent pickup processing (S11), and if an electronic component is picked up, the electronic component is mounted on board Bd in mounting processing (S12).

In this manner, recovery processing that is one type of countermeasure processing for pickup errors is performed as an automatic recovery method when a random pickup error occurs, and is processing that does not interrupt mounting processing (does not stop component mounting machine 1). However, depending on the cause of the pickup error, it is necessary to perform exchange processing of carrier tape 90 at feeder 70, recovery work by an operator, or the like.

Here, recovery processing is configured to be performed in a case in which the quantity of consecutive pickup errors during multiple pickup operations is less than a threshold value. The above threshold value is a value set as a reference for whether to perform recovery processing. The threshold value is set to an initial value in advance by an operator and is memorized in memory device 52.

Tape management section 63 acquires the remaining amount of carrier tape 90 at feeder 70. In the present embodiment, tape management section 63 acquires the remaining amount of carrier tape 90 based on the detection results from the trailing end detecting section (multiple detection sensors 77 to 79 and the like), and the remaining amount of feeding operation of carrier tape 90 by feeder 70.

In detail, tape management section 63 calculates the remaining amount of current carrier tape 90 based on the operation amount of first driving device 73 after the trailing end of carrier tape 90 has passed detection sensors 77 to 79 (which is equivalent to the feeding amount of carrier tape 90). Also, tape management section 63 may recognize that the remaining amount of carrier tape 90 has been reduced to less than the specified amount based on, for example, the fact that first detection sensor 77 can no longer detect carrier tape 90.

Threshold changing section 64 changes the threshold value in accordance with the remaining amount of carrier tape 90 acquired by tape management section 63. In the present embodiment, threshold changing section 64, in a case in which the remaining amount of carrier tape 90 has been reduced to less than the specified amount, changes the threshold value to a value larger than the set value before the reduction. Further, threshold changing section 64, for example, returns the threshold value to its initial value before changing in a case in which exchange processing of carrier tape 90 at feeder 70 is performed and the remaining amount of carrier tape 90 is less than the specified amount. The changed threshold value is memorized in memory device 52.

Tape exchange control section 65 performs exchange processing at feeder 70 in a case in which the remaining amount of current carrier tape 90 is less than the specified amount, and the quantity of consecutive pickup errors during multiple pickup operations is less than the threshold value. In the present embodiment, tape exchange control section 65 recognizes the remaining amount of carrier tape 90 is less than the specified amount when the trailing end of carrier tape 90 has passed first detection sensor 77.

Also, tape exchange control section 65 determines that the pickup error occurred due to components running out in a case in which the quantity of consecutive pickup errors during multiple pickup operations using the same feeder 70 is equal to or greater than the threshold value that is currently memorized in memory device 52. Then, tape exchange control section 65 outputs an exchange instruction to feeder 70 such that exchange processing of carrier tape 90 is performed.

Notification control section 66 issues a notice of an error with pickup operation in a case in which the remaining amount of current carrier tape 90 is equal to or greater than the specified amount and the quantity of consecutive pickup errors during multiple pickup operations is equal to or greater than the threshold value. In the present embodiment, notification control section 66 recognizes the remaining amount of carrier tape 90 is equal to or greater than the specified amount when carrier tape 90 is detected by first detection sensor 77.

Also, notification control section 66 determines that the pickup error occurred due to a cause other than components running out (for example, a problem with the tip of the suction nozzle) in a case in which the quantity of consecutive pickup errors during multiple pickup operations using the same feeder 70 is equal to or greater than the threshold value that is currently memorized in memory device 52. Here, notification control section 66, for example, guides an operator to perform recovery work by displaying that there was an error with pickup operation on the display section of control device 50.

Pickup Error Countermeasure Processing

Figure 5:
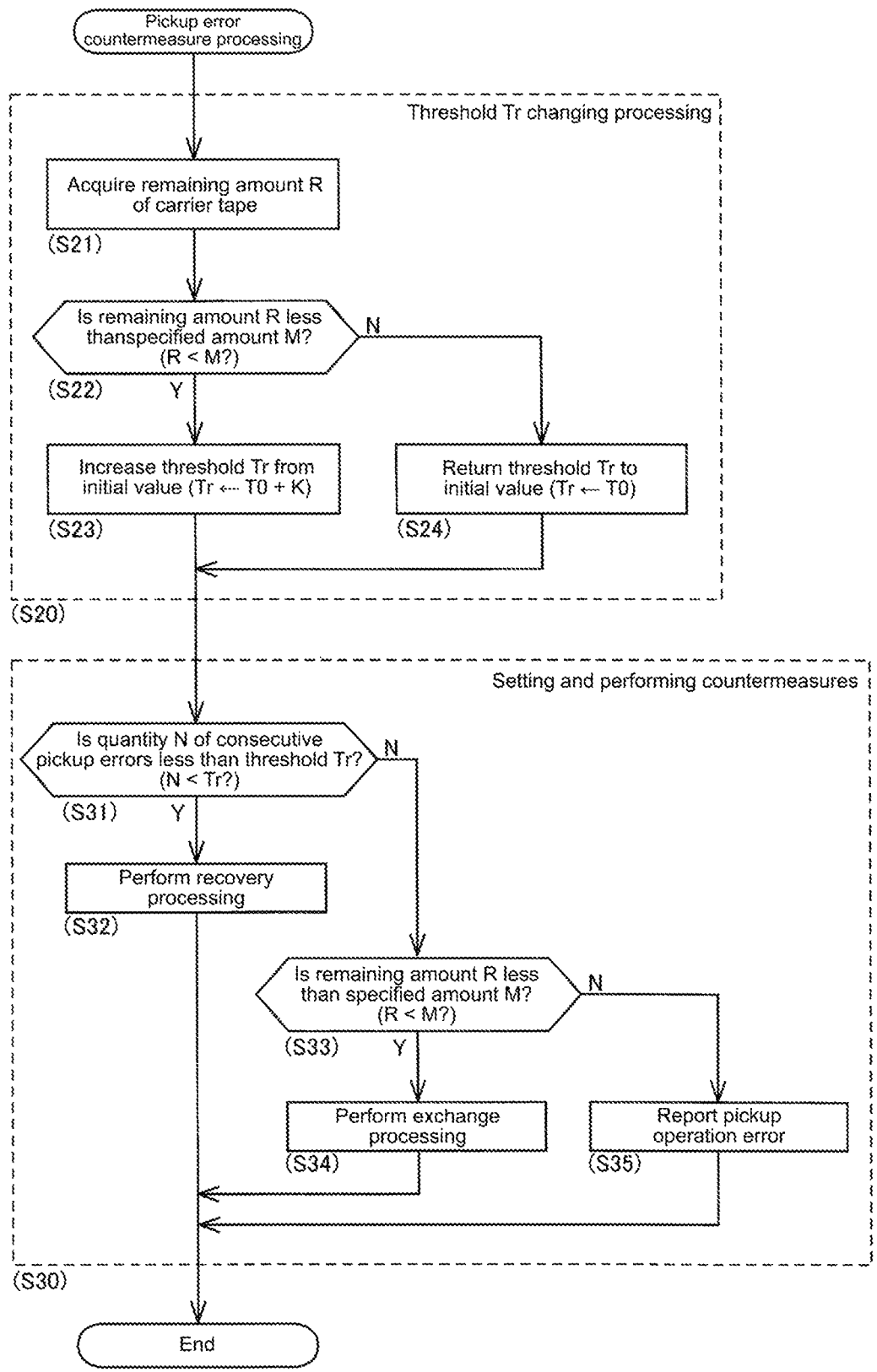
FIG. 5 is a flowchart showing processing related to a pickup error detected during pickup operation.

Countermeasure processing for a pickup error that is detected during mounting processing will be described with reference to FIG. 5. This countermeasure processing is performed when a pickup error is detected by error detecting section 61 during state recognition processing of mounting processing (S12), for example. Control device 50 first performs changing processing of threshold value Tr (S20).

During changing processing of threshold value Tr (S20), tape management section 63 acquires remaining amount R of carrier tape 90 in feeder 70. Specifically, tape management section 63 acquires whether first detection sensor 77 of feeder 70 is detecting carrier tape 90. Then, tape management device 63 determines whether remaining amount R of carrier tape 90 is less than specified amount M. Here, in the present embodiment, "specified amount M" is equivalent to an amount of carrier tape 90 from pickup section Dt of feeder 70 to first detection sensor 77.

Thus, tape management device 63, in a case in which first detection sensor 77 is not detecting carrier tape 90, determines that remaining amount R of carrier tape 90 is less than specified amount M (S22: Yes). Then, threshold changing section 64, because remaining amount R of carrier tape 90 has been reduced to less than specified amount M, changes threshold value Tr to a value larger than the set value (that is, initial value T0) from before remaining amount R was reduced (S23). Specifically, threshold changing section 64 adds change constant K to the threshold value Tr that was set as initial value T0.

On the other hand, tape management section 63, in a case in which first detection sensor 77 is detecting carrier tape 90, determines that remaining amount R of carrier tape 90 is equal to or more than specified amount M (S22: No). Then, threshold changing section 64, for example, due to exchange processing of carrier tape 90, because remaining amount R of carrier tape 90 is equal to or greater than specified amount M, returns threshold value Tr to initial value T0 from before changing (S24).

Continuing, control device 50 sets and performs processing as a countermeasure to a pickup error (S30). Specifically, control device 50 compares quantity N that is the quantity of pickup errors that have occurred consecutively during multiple pickup operations using the same feeder 70 with the currently set threshold value Tr (S31). If the quantity N of consecutive pickup errors is less than threshold value Tr (S31: Yes), recovery control section 62 performs recovery processing (S32). By this, mounting control section 51 performs control such that pickup of an electronic component is attempted by performing pickup operation again.

On the other hand, if the quantity N of consecutive pickup errors is equal to or greater than threshold value Tr (S31: No), and remaining amount R of current carrier tape 90 is less than specified amount M (S33: Yes), tape exchange control section 65 performs exchange processing of carrier tape 90 of feeder 70 on the condition that replenishment carrier tape 90 is set at insertion section Di (S34). By this, at feeder 70, current carrier tape 90 for which remaining amount R has become less than specified amount M is ejected, and replenishment carrier tape 90 is fed such that electronic components can be supplied.

Note that, tape exchange control section 65 determines whether replenishment carrier tape 90 is set at insertion section Di based on the detection result of third detection sensor 79 of feeder 70. Tape exchange control section 65, if determining that replenishment carrier tape 90 is not set at insertion section Di, notifies an operator that replenishment carrier tape 90 needs to be set on feeder 70. Then, tape exchange control section 65, if detecting that an operator has set replenishment carrier tape 90 of feeder 70, performs exchange processing of carrier tapes 90 at feeder 70.

Also, in a case in which the quantity N of consecutive pickup errors is threshold value Tr or greater (S31: No) and remaining quantity R of current carrier tape 90 is equal to or greater than specified quantity M (S33: No), notification control section 66 takes it that the pickup error occurred for a reason other than components running out and issues a pickup operation error. Notification control section 66 displays error contents on the display section of control device 50 and guides an operator to perform recovery work.

During the above processing (S20, S30), if initial value T0 of threshold value Tr is taken as "2", and change constant K is taken as "1", the relationship between countermeasures according to the quantity N of consecutive pickup errors and remaining amount R of carrier tape 90 is as given in the countermeasures table of FIG. 6. That is, if remaining amount R of carrier tape 90 is equal to or greater than specified amount M, threshold value Tr is set to initial value T0 (Tr=T0=2). Accordingly, recovery processing is performed with respect to the first pickup error that is less than initial value T0 (S32), but if consecutive pickup errors occur twice (equal or greater than Tr), a pickup operation error is reported (S35).

On the other hand, if remaining amount R of carrier tape 90 is less than specified amount M, threshold value Tr is set to a value equal to the current set value (initial value T0) plus change constant K (Tr=T0+K=3). By this, recovery processing is performed until the second consecutive pickup error, which is less than threshold Tr (S32), and when the third (equal to or greater than threshold Tr) consecutive pickup error occurs, exchange processing is performed at feeder 70 (S34).

That is, assuming that threshold value Tr has not changed, remaining amount R of carrier tape 90 is less than specified amount M, and when a pickup error occurs twice consecutively, exchange processing of carrier tape 90 is performed instead of recovery processing. Here, if cause of the pickup error is other than components running out, the electronic components remaining in carrier tape 90 to be ejected by performing exchange processing are discarded.

With respect to this, as described above, by changing such that threshold value Tr is increased in accordance with remaining amount R of carrier tape 90, opportunities to perform recovery processing are increased. Thus, when picking up an electronic component by performing attempting to perform pickup operation again, because performing unnecessary exchange processing can be curtailed, electronic components are prevented from being discarded.

Effects from the Configuration of the Embodiment

Control device 50 of component mounting machine 1 is applied to component mounting machine 1 that mounts electronic components on circuit board Bd. Component mounting machine 1 is provided with feeders 70 that supply electronic components by feeding carrier tape 90 in which electronic components are housed. Control device 50 is provided with error detecting section 61 configured to detect a pickup error in which the electronic component was not picked up during pickup operation of picking up and holding the electronic component supplied by feeder 70; recovery control section 62 configured to perform recovery processing of picking up the electronic component by performing the pickup operation again in a case in which quantity N of the pickup errors that has occurred consecutively during multiple attempts at the pickup operation is less than threshold value Tr; tape management section 63 configured to acquire remaining amount R of carrier tape 90 at feeder 70; and threshold changing section 64 configured to change threshold value Tr based on the acquired remaining amount R of carrier tape 90.

According to such a configuration, threshold value Tr, which is a reference by which it is determined whether or not to perform recovery processing, is changed automatically in accordance with remaining amount R of carrier tape 90 (S23, S24). Here, a pickup error is something that causes a supply error such as components running out at a feeder 70. Thus, remaining amount R of carrier tape 90 can be used as an indicator that shows whether it is necessary to perform recovery processing with respect to a pickup error that has occurred. For this, by the above configuration, it is possible to appropriately perform recovery processing in accordance with the state of carrier tape 90 (S32).

Then, threshold changing section 64, if remaining amount R of carrier tape 90 has been reduced to less than specified amount M (S22: Yes), changes threshold value Tr to a value larger than the set value before the reduction (S23).

Here, in a case in which remaining amount R of carrier tape 90 is less than specified amount M and consecutive pickup errors have occurred, for example, countermeasures are performed by discarding the current carrier tape 90 and exchanging it with replenishment carrier tape 90. Here, if cause of the pickup error is other than components running out, the cause has been mistakenly identified, and the electronic components remaining in the current carrier tape 90 are discarded. For this, according to the above configuration, recovery processing can be performed more times by the difference of the changed threshold value Tr compared to the set value in a case when remaining amount R of carrier tape 90 is equal to or greater than specified amount M. This prevent electronic components from being discarded due to incorrect identification of the cause of a pickup error.

Also, threshold changing section 64, in a case in which remaining amount R of carrier tape 90 is equal to or greater than specified amount M, returns threshold value Tr to the pre-change initial value T0. According to such a configuration, it is possible to appropriately perform recovery processing in accordance with the exchange state or the like of carrier tape 90.

Also, feeder 70 is an auto loading type feeder that performs exchange processing of creating a state in which electronic components can be supplied by, when remaining amount R of current carrier tape 90 is less than specified amount M, ejecting current carrier tape 90 and feeding replenishment carrier tape 90. Control device 50 is also provided with: tape exchange control section 65 that performs exchange processing at feeder 70 when remaining amount R of current carrier tape 90 is less than specified amount M (S33: Yes), and the quantity N of consecutive pickup errors during multiple pickup operations is equal to or greater than threshold value Tr (S31: No); and notification control section 66 that reports a pickup operation error when remaining amount R of current carrier tape 90 is equal to or greater than specified amount M (S33: No), and the quantity N of consecutive pickup errors during multiple pickup operations is equal to or greater than threshold value Tr (S31: No).

In auto loading type feeder 70, when a specified quantity of pickup errors is detected, exchange processing of carrier tape 90 is performed in addition to performing recovery processing. However, if the cause of the pickup error is not components running out, due to the above exchange processing, the electronic components remaining in the current carrier tape 90 are discarded. With respect to this, according to the above configuration, by increasing threshold value Tr when remaining amount R of carrier tape 90 is less than specified amount M (S23), recovery processing can be performed more times, which prevents electronic components from being discarded due to incorrect identification of the cause of a pickup error.

Also, feeder 70 is provided with a trailing end detecting section (multiple detection sensors 77 and the like) that detects the trailing end of carrier tape 90 on the conveyance path along which carrier tape 90 is fed. Tape management section 63 acquires remaining amount R of carrier tape 90 based on the operation amount of the feeding of carrier tape 90 by feeder 70 and the detection results of the trailing end detecting section.

According to such a configuration, control device 50 is able to identify remaining amount R of carrier tape 90 at feeder 70. By this, changing in accordance with remaining amount R of carrier tape 90 is possible, and when a pickup error occurs, it is possible to reliably determine whether to perform recovery processing.

ALTERNATIVE EMBODIMENTS

First Alternative Embodiment

In the above embodiment, feeder 70 is an auto loading type feeder capable of performing exchange processing of carrier tape 90. In contrast, it is also possible to apply the present disclosure to a standard type feeder and a type that supports splicing feeder, which do not have a function for performing exchange processing.

With the above standard type feeder, for example, removal of current carrier tape 90 and loading of replenishment carrier tape 90 is performed manually by an operator so as to create a state in which supplying electronic components is possible. Further, with a feeder type that supports splicing, consecutive feeding of carrier tape 90 is enabled by using splicing tape to join current carrier tape 90 and replenishment carrier tape 90 in advance.

Figure 7:
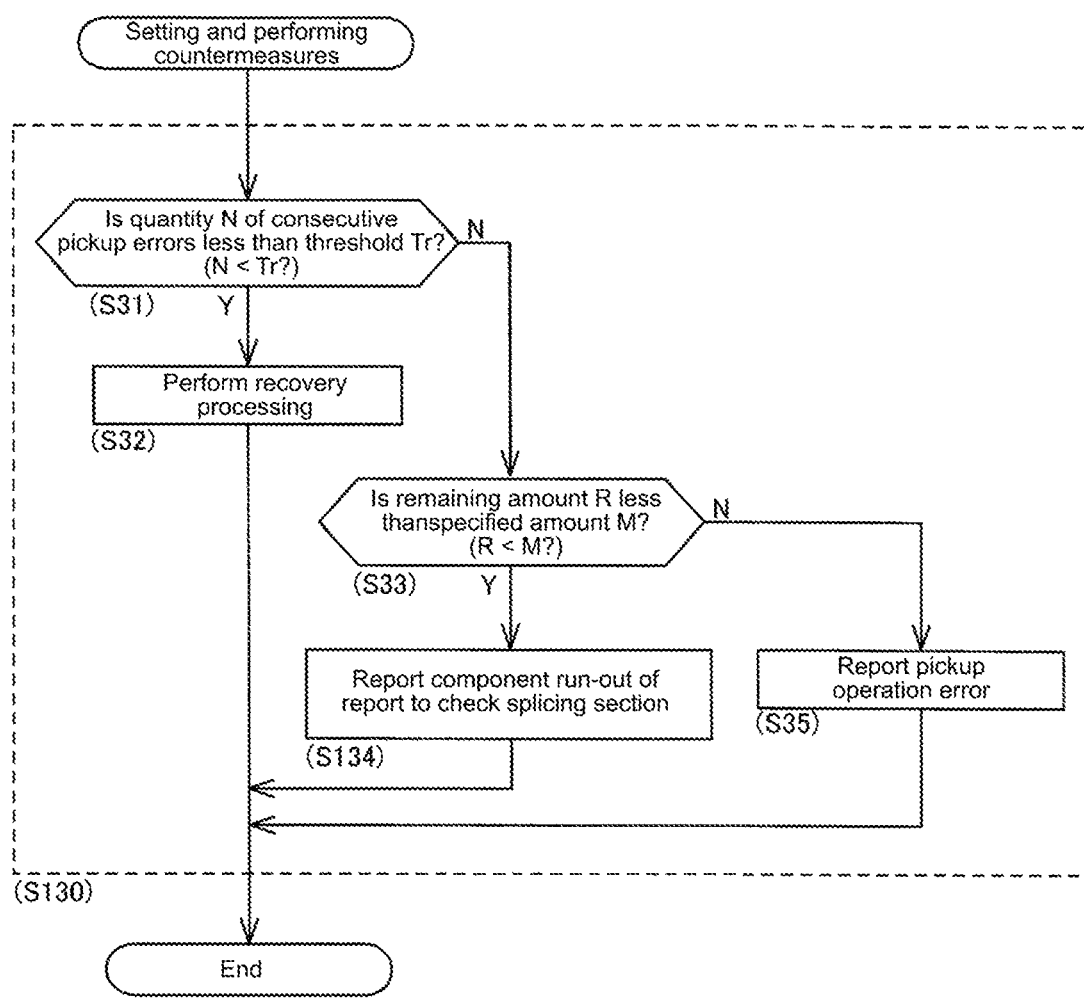
FIG. 7 is a flowchart showing processing related to "setting and performing countermeasures" of FIG. 5 in a first alternative embodiment.

When applying the present disclosure to the above standard type and splicing type feeders, as shown in FIG. 7, countermeasures are set and performed (S130) during pickup error countermeasure processing. In detail, if the quantity N of consecutive pickup errors is equal to or greater than threshold value Tr (S31: No), and remaining amount R of current carrier tape 90 is less than specified amount M (S33: Yes), tape exchange control section 65 performs reporting to an operator in accordance with the feeder type (S134).

Specifically, for a standard type feeder, it is reported that components have run out, and an operator is guided to exchange carrier tape 90. Further, for a splicing type feeder, considering the possibility that there is an error with the trailing end section of carrier tape 90, that is, an error with the splicing section that is the join at which the two carrier tapes are connected to each other, the operator is notified to check the splicing section. Accordingly, countermeasures are performed in accordance with the type of feeder, and the feeder can be returned to a state in which supply of electronic components is possible. Other processing is practically the same as the first embodiment, so detailed descriptions are omitted.

During the above processing (S20, S30), if initial value T0 of threshold value Tr is taken as "2", and change constant K is taken as "1", the relationship between countermeasures according to the quantity N of consecutive pickup errors and remaining amount R of carrier tape 90 is as given in the countermeasures table of FIG. 8. That is, if remaining amount R of carrier tape 90 is less than specified amount M, threshold value Tr is set to a value equal to the current set value (initial value T0) plus change constant K (Tr=T0+K=3). By this, recovery processing is performed until the second consecutive pickup error, which is less than threshold Tr (S32), and when the third (equal to or greater than threshold Tr) consecutive pickup error occurs, notification processing in accordance with the type of feeder 70 is performed (S134).

According to such a configuration, recovery processing can be appropriately performed in accordance with remaining amount R of carrier tape 90. Also, when the quantity N of consecutive pickup errors is equal to or greater than threshold value Tr (S31: No), based on remaining amount R of carrier tape 90, reporting in accordance with the type of feeder (S134) or reporting of a pickup operation error (S35) can be performed. Thus, it is possible to guide an operator to perform recovery work in accordance with the state of the feeder.

Second Alternative Embodiment

During changing processing of threshold value Tr of the first embodiment (S20), threshold changing section 64, in a case in which remaining amount R of carrier tape 90 has been reduced to less than specified amount M, changes threshold value Tr to a value larger than the set value (that is, initial value T0) from before the reduction. In contrast, threshold changing section 64, in a case in which remaining amount R of carrier tape 90 has been reduced to less than specified amount M, may change threshold value Tr to a value smaller than the set value before the reduction.

During the processing (S20, S30) as applied to a second alternative embodiment, if initial value T0 of threshold value Tr is taken as "2", and change constant K is taken as "−1", the relationship between countermeasures according to the quantity N of consecutive pickup errors and remaining amount R of carrier tape 90 is as given in the countermeasures table of FIG. 9. That is, if remaining amount R of carrier tape 90 is less than specified amount M, threshold value Tr is set to a value equal to the current set value (initial value T0) plus change constant K (Tr=T0+K=1). Accordingly, when a pickup error is detected for the first time, which is less than threshold value Tr, exchange processing is performed at feeder 70 (S34) without performing recovery processing.

That is, assuming that threshold value Tr has not changed, remaining amount R of carrier tape 90 is less than specified amount M, and when a pickup error is detected for the first time, recovery processing is performed instead of exchange processing of carrier tape 90. Here, if cause of the pickup error is other than components running out, the electronic components remaining in carrier tape 90 to be ejected by performing exchange processing are discarded.

However, if it is highly likely that the cause of the pickup error was running out of components in a case in which remaining amount R of carrier tape 90 is less than specified amount M, there are cases in which it is effective to omit recovery processing, or to reduce the opportunities for performing recovery processing to less than usual, and to perform exchange processing of carrier tape 90 at an early stage. According to such a configuration, it is possible to reduce the quantity of pickup errors that occur due to components running out at feeder 70 that is an auto loading type.

Third Alternative Embodiment

During changing processing of threshold value Tr of the first embodiment (S20), threshold changing section 64 sets to one of initial value T0 or initial value T0 to which change constant K has been added (S23, S24). In contrast, threshold changing section 64 may be configured to change threshold value Tr in levels in accordance with remaining amount R of carrier tape 90.

Specifically, threshold changing section 64, for example, may change threshold value Tr such that threshold value Tr increases incrementally in accordance with a reduction in remaining amount R of carrier tape 90. Note that, remaining amount R of carrier tape 90, for example, may be calculated based on the operation amount of the feeding operation of carrier tape 90 after the trailing end of carrier tape 90 has passed the detection position of the first detection sensor 77. The operation amount of the feeding operation of carrier tape 90, for example, may be calculated based on the pulse quantity sent to the stepping motor of first driving device 73 of feeder 70, or the supply quantity of electronic components by feeder 70.

According to such a configuration, it is possible to set threshold value Tr in levels in accordance with remaining amount R of carrier tape 90. Accordingly, even more effectively, it is possible to appropriately perform recovery processing in accordance with the state of carrier tape 90.

Also, this configuration may be combined with the second alternative configuration. That is, threshold changing section 64 may increase threshold value Tr when remaining amount R of carrier tape 90 has been reduced to less than specified amount M, and may reduce threshold value Tr in a case in which there is a high possibility that components have run out after further reducing remaining amount R. By this, it is possible to appropriately perform recovery processing in accordance with the state of carrier tape 90 at feeder 70, and to effectively perform exchange processing of carrier tapes 90.

REFERENCE SIGNS LIST

1: component mounting machine; 10: board conveyance device; 20: component supply device; 21: slot; 22: reel holding section; 30: component transfer device; 31: head driving device; 32: moving body; 33: mounting head; 41: component camera; 42: board camera; 50: control device; 51: mounting control section; 52: memory device; 61: error detecting section; 62: recovery control section; 63: tape management section; 64: threshold changing section; 65: tape exchange control section; 66: notification control section; 70: feeder; 71: case; 72: rail; 73: first driving section; 74: second driving section; 75: tape feeding unit; 76: tape peeling unit; 77 to 79: detection sensors (trailing end detecting section); 81: first reel; 82: second reel; Dt: pickup section; Dn: intermediate section; Di: insertion section; 90: carrier tape; 91: base tape; 91a: component storage sections; 91b: indexing holes; 92: cover tape; Bd: board (circuit board); Ps: supply position; R: remaining amount (of carrier tape); M: specified amount; N: quantity of consecutive pickup errors; Tr: (current) threshold value; T0: initial value (of threshold value); K: change constant

The invention claimed is:

1. A control device for a component mounting machine, which is for mounting electronic components on a circuit board and which is provided with a feeder that supplies the electronic components by feeding carrier tape housing the electronic components, the control device comprising:
   an error detecting section configured to detect a pickup error in which the electronic component was not picked up during pickup operation of picking up and holding the electronic component supplied by the feeder;
   a recovery control section configured to perform recovery processing of picking up the electronic component by performing the pickup operation again in a case in which a quantity of the pickup errors that has occurred consecutively during multiple attempts at the pickup operation is less than a threshold value;
   a tape management section configured to acquire a remaining amount of the carrier tape at the feeder; and
   a threshold changing section configured to change the threshold value based on the acquired remaining amount of the carrier tape.

2. The control device for the component mounting machine according to claim 1, wherein
   the threshold changing section is configured to, in a case in which the remaining amount of the carrier tape has decreased to less than a specified amount, change the threshold value to a value larger than a value set before the decrease.

3. The control device for the component mounting machine according to claim 2, wherein
   the threshold changing section is configured to change the threshold value such that the threshold value gradually increases as the remaining amount of the carrier tape decreases.

4. The control device for the component mounting machine according to claim 1, wherein
   the threshold changing section is configured to, in a case in which the remaining amount of the carrier tape is equal to or greater than a specified amount, return the threshold value to an initial value that was the threshold value before the change.

5. The control device for the component mounting machine according to claim 1, wherein
   the feeder is an auto loading type feeder configured to, when the remaining amount of the carrier tape that is a current carrier tape has reached lower than a specified amount, perform exchange processing in which the current carrier tape is ejected and a replenishment carrier tape is fed so as to exchange the carrier tapes and enable the electronic components to be in a state in which supply is possible, and
   the control device is further provided with
   a tape exchange control section configured to perform the exchange processing at the feeder when the remaining amount of the current carrier tape is less than the specified amount and the quantity of the pickup errors that has occurred consecutively during multiple of the pickup operations is equal to or greater than the threshold value, and
   a notification control section configured to issue a notice of a problem with the pickup operation when the remaining amount of the current carrier tape is equal to or greater than the specified amount and the quantity of the pickup errors that has occurred consecutively during multiple of the pickup operations is equal to or greater than the threshold value.

6. The control device for the component mounting machine according to claim 1, wherein
   the control device is further provided with a notification control section configured to issue a notice of a problem with an end section of the carrier tape or of a need to exchange the carrier tape when the remaining amount of the carrier tape is less than the specified amount, and the quantity of the pickup errors that has occurred consecutively during multiple of the pickup operations is equal to or greater than the threshold value, and
   the notification control section issues the notice of the problem with the pickup operation when the remaining amount of the carrier tape is equal to or greater than the specified amount, and the quantity of the pickup errors that has occurred consecutively during multiple of the pickup operations is equal to or greater than the threshold value.

7. The control device for the component mounting machine according to claim 1, wherein
   the feeder is provided with an end detecting section configured to detect the end of the carrier tape, the end detecting section being provided along a conveyance path along which the carrier tape is fed, and
   the tape management section is configured to acquire the remaining amount of the carrier tape based on a result of the detection by the end detecting section and an operation amount of a feeding operation of the carrier tape by the feeder.

* * * * *